United States Patent
Kim et al.

(10) Patent No.: US 9,627,363 B2
(45) Date of Patent: Apr. 18, 2017

(54) DISPLAY DEVICE USING SEMICONDUCTOR LIGHT EMITTING DEVICES

(71) Applicant: LG ELECTRONICS INC., Seoul (KR)

(72) Inventors: Chisun Kim, Seoul (KR); Byungjoon Rhee, Seoul (KR); Bongchu Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/794,305

(22) Filed: Jul. 8, 2015

(65) Prior Publication Data

US 2016/0240517 A1  Aug. 18, 2016

(30) Foreign Application Priority Data

Feb. 17, 2015 (KR) ........................ 10-2015-0024425

(51) Int. Cl.
| | |
|---|---|
| H01L 25/07 | (2006.01) |
| H01L 25/075 | (2006.01) |
| G09F 9/33 | (2006.01) |
| H01L 33/62 | (2010.01) |
| H01L 33/20 | (2010.01) |

(52) U.S. Cl.
CPC ............ H01L 25/0753 (2013.01); G09F 9/33 (2013.01); H01L 33/20 (2013.01); H01L 33/62 (2013.01)

(58) Field of Classification Search
CPC .................................................. H01L 25/0753
See application file for complete search history.

(56) References Cited

U.S. PATENT DOCUMENTS

| | | | |
|---|---|---|---|
| 7,432,187 B1* | 10/2008 | Cok | 438/609 |
| 2005/0045899 A1* | 3/2005 | Tsutsui | H01L 24/83 257/99 |
| 2005/0189558 A1* | 9/2005 | Liu | 257/100 |
| 2005/0230853 A1 | 10/2005 | Yoshikawa | |
| 2007/0001564 A1 | 1/2007 | Park | |
| 2011/0128713 A1* | 6/2011 | Kawano et al. | 361/784 |
| 2012/0153329 A1 | 6/2012 | Cho | |
| 2013/0228808 A1* | 9/2013 | Lester | 257/98 |
| 2014/0061704 A1* | 3/2014 | Yamada et al. | 257/98 |
| 2015/0115296 A1 | 4/2015 | Rhee et al. | |

FOREIGN PATENT DOCUMENTS

| | | |
|---|---|---|
| JP | 2004-23061 A | 1/2004 |
| JP | 2007-13143 A | 1/2007 |
| KR | 10-2012-0067643 A | 6/2012 |
| KR | 10-2014-0128668 A | 11/2014 |
| KR | 10-1476687 B1 | 12/2014 |

* cited by examiner

Primary Examiner — Matthew Reames
(74) Attorney, Agent, or Firm — Birch, Stewart, Kolasch & Birch, LLP

(57) ABSTRACT

A display device including a wiring substrate having a wiring electrode; a plurality of semiconductor light emitting devices which form pixels; and a conductive adhesive layer configured to electrically connect the wiring electrode with the plurality of semiconductor light emitting devices. Further, the conductive adhesive layer includes a body provided with a resin having an adhesive property; and a metallic aggregation part disposed in the body, and formed as metallic atoms precipitated from a metal-organic compound and aggregated with each other.

13 Claims, 17 Drawing Sheets

DISPLAY DEVICE USING SEMICONDUCTOR LIGHT EMITTING DEVICES

CROSS-REFERENCE TO RELATED APPLICATION

Pursuant to 35 U.S.C. §119(a), this application claims the benefit of earlier filing date and right of priority to Korean Application No. 10-2015-0024425, filed on Feb. 17, 2015, the contents of which is incorporated by reference herein in its entirety.

BACKGROUND OF THE INVENTION

1. Field of the Invention

The present invention relates to a display device, and more particularly, to a flexible display device using semiconductor light emitting devices.

2. Background of the Invention

Display devices having excellent characteristics such as a low profile, flexibility and the like. Further, currently commercialized main displays are represented by liquid crystal displays (LCDs) and active matrix organic light emitting diodes (AMOLEDs). However, there exist problems such as a slow response time, difficult implementation of flexibility for LCDs, and there exist drawbacks such as a short life span, poor yield as well as low flexibility for AMOLEDs.

Further, light emitting diodes (LEDs) have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display.

SUMMARY OF THE INVENTION

Therefore, an aspect of the detailed description is to provide an electrical connection structure having reliability between a wiring substrate and semiconductor light emitting devices, in a novel type of flexible display device.

Another aspect of the detailed description is to provide a display device having a connection wiring structure of a fine pitch.

To achieve these and other advantages and in accordance with the purpose of this specification, as embodied and broadly described herein, there is provided a display device including: a wiring substrate having a wiring electrode; a plurality of semiconductor light emitting devices which form pixels; and a conductive adhesive layer configured to electrically connect the wiring electrode with the plurality of semiconductor light emitting devices, wherein the conductive adhesive layer includes: a body provided with a resin having an adhesive property; and a metallic aggregation part disposed in the body, and formed as metallic atoms precipitated from a metal-organic compound are aggregated with each other.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
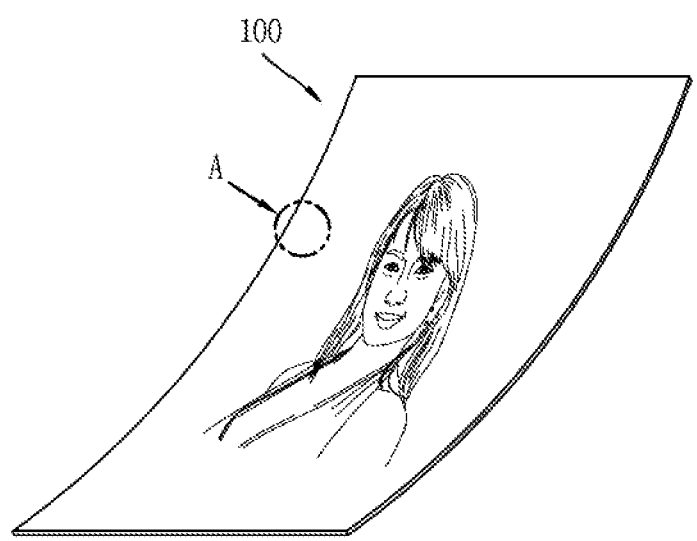
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function.

Also, it should be noted that the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, a configuration disclosed herein may be applicable to any displayable device even though it is a new product type which will be developed later.

FIG. 1 is a conceptual view illustrating a display device 100 using a semiconductor light emitting device according to an embodiment of the present disclosure. As shown in FIG. 1, information processed in the controller of the display device 100 can be displayed using a flexible display. The flexible display includes a flexible, bendable, twistable, foldable and rollable display. For example, the flexible display can be fabricated on a thin and flexible substrate that can be warped, bent, folded or rolled like a paper sheet while maintaining the display characteristics of a flat display.

A display area of the flexible display becomes a plane when the flexible display is not warped (for example, a configuration having an infinite radius of curvature, hereinafter, referred to as a "first configuration"). The display area thereof becomes a curved surface when the flexible display is warped by an external force in the first configuration (for example, a configuration having a finite radius of curvature, hereinafter, referred to as a "second configuration"). As illustrated in FIG. 1, information displayed in the second configuration includes visual information displayed on a curved surface.

The visual information may be implemented by individually controlling the light emission of sub-pixels disposed in a matrix form. Further, the sub-pixel denotes a minimum unit for implementing one color, and may be implemented by a semiconductor light emitting device. According to an embodiment of the present disclosure, a light emitting diode (LED) is illustrated as a type of semiconductor light emitting device. The light emitting diode can be formed with a small size to perform the role of a sub-pixel even in the second configuration.

Hereinafter, a flexible display implemented using the light emitting diode will be described in more detail, with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
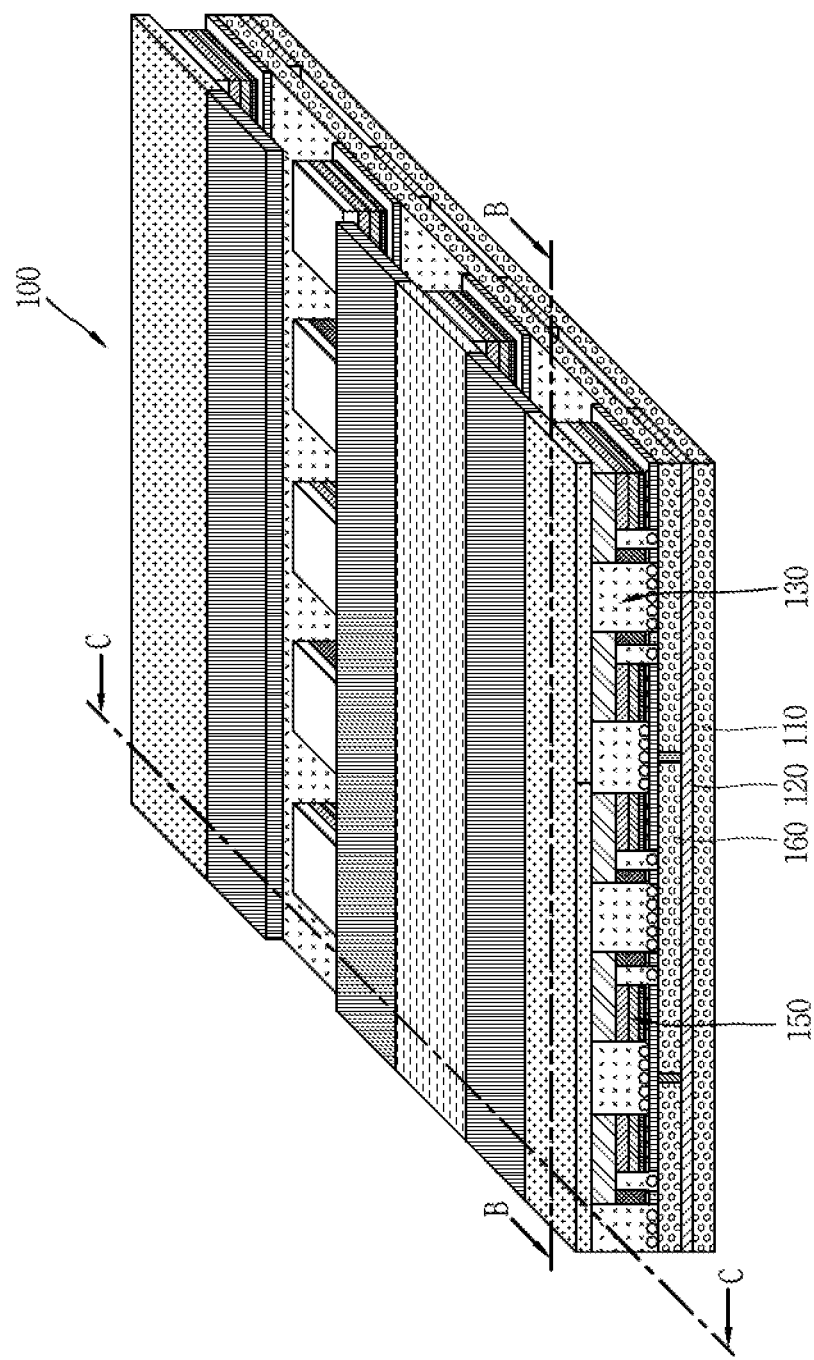
FIG. 2 is a partial enlarged view of portion "A" in FIG. 1.
Figure 3A:
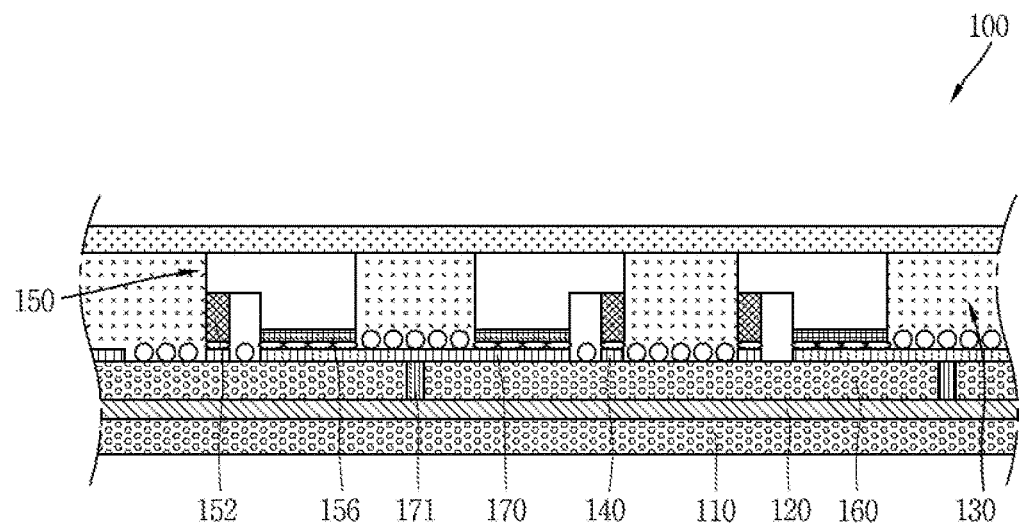
FIGS. 3A and 3B are cross-sectional views taken along lines B-B and C-C in FIG. 2.
Figure 3B:
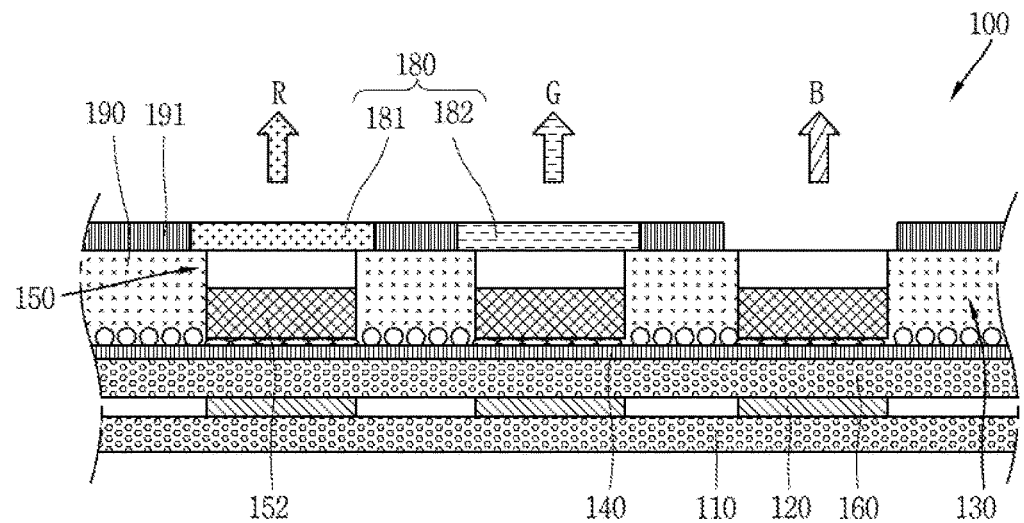
Figure 4:
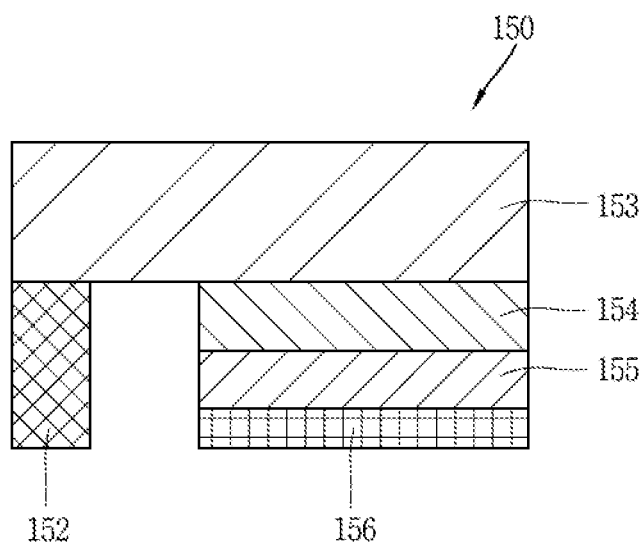
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device. However, the following illustration is also applicable to an active matrix (AM) type semiconductor light emitting device.

As shown, the display device 100 may include a substrate 110, a first electrode 120, a conductive adhesive layer 130, a second electrode 140, and a plurality of semiconductor light emitting devices 150. The substrate 110 may be a flexible substrate, and contain glass or polyimide (PI) to implement the flexible display device. In addition, a flexible material, such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110. As shown, an insulating layer 160 may be disposed on the substrate 110 including the first electrode 120, and an auxiliary electrode 170 may be placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure is not limited to this. For example, it is possible to also have a structure in which the conductive adhesive layer 130 is disposed on the substrate 110 with no insulating layer 160. Further, the conductive adhesive layer 130 may perform the role of an insulating layer in the structure in which the conductive adhesive layer 130 is disposed on the substrate 110.

In addition, the conductive adhesive layer 130 has adhesiveness and conductivity, and thus, a conductive material and an adhesive material may be mixed on the conductive adhesive layer 130. Furthermore, the conductive adhesive layer 130 can have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having an electrical insulation in the horizontal x-y direction thereof. Accordingly, the conductive adhesive layer 130 may be referred to as a z-axis conductive layer (hereinafter referred to as a "conductive adhesive layer").

The anisotropic conductive film has a form in which an anisotropic conductive medium is mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods include applying only either one of heat and pressure thereto, UV curing, and the like.

Furthermore, the anisotropic conductive medium may be conductive balls or particles. According to the drawing, in the present embodiment, the anisotropic conductive film has a form in which an anisotropic conductive medium is mixed with an insulating base member, and thus when heat and pressure are applied thereto, only a specific portion thereof has conductivity by the conductive balls. The anisotropic conductive film may be a core with a conductive material containing a plurality of particles coated by an insulating layer with a polymer material, and in this instance, it may have conductivity by the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and an electrical connection in the z-axis direction is partially formed by a height difference from a mating object adhered by the use of the anisotropic conductive film. In another example, an anisotropic conductive film may include a plurality of particles in which a conductive material is coated on insulating cores. In this instance, a portion to which heat and pressure are applied can be converted (pressed and adhered) to a conductive material to have a conductivity in the thickness direction of the film. In still another example, the film can be formed to have conductivity in the thickness direction in which a conductive material passes through an insulating base member in the z-direction. In this instance, the conductive material may have a pointed end portion.

According to the drawing, the anisotropic conductive film may be a fixed array anisotropic conductive film (ACF) in which conductive balls are inserted into one surface of the insulating base member. More specifically, the insulating base member includes an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or a plurality of layers in which conductive balls are disposed at any one layer (double-ACF), and the like. The anisotropic conductive paste may include conductive balls mixed with an insulating and adhesive base material. Furthermore, a solution containing conductive particles may include conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 150 may be a flip chip type semiconductor light emitting device. For example, the semiconductor light emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode. More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity.

Furthermore, a plurality of semiconductor light emitting devices 150 constitute a light-emitting array, and a phosphor layer 180 is formed on the light-emitting array. The light emitting device may include a plurality of semiconductor light emitting devices with different self luminance values. Each of the semiconductor light emitting devices 150 constitutes a sub-pixel, and is electrically connected to the first electrode 120. For example, a plurality of first electrodes 120 can exist and the semiconductor light emitting devices 150 are arranged in several rows, for instance, and each row of the semiconductor light emitting devices 150 can be electrically connected to any one of the plurality of first electrodes.

Furthermore, the semiconductor light emitting devices 150 may be connected in a flip chip form, and thus semiconductor light emitting devices grown on a transparent dielectric substrate. In addition, the semiconductor light emitting devices 150 may be nitride semiconductor light emitting devices, for instance. The semiconductor light emitting device 150 has an excellent luminance characteristic, and thus it is possible to configure individual sub-pixels even with a small size thereof.

According to FIG. 3B, a partition wall 190 may be formed between the semiconductor light emitting devices 150. In this instance, the partition wall 190 divides individual sub-pixels from one another, and may be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator. In another example, a reflective partition wall may be separately provided with the partition wall 190. In this instance, the partition wall 190 may include a black or white insulator according to the purpose of the display device. Further, the partition wall 190 may have an effect of enhancing reflectivity when the partition wall of the while insulator is used, and increase contrast while at the same time having reflective characteristics.

In addition, the phosphor layer 180 may be located at an outer surface of the semiconductor light emitting device 150. For example, the semiconductor light emitting device 150 can be a blue semiconductor light emitting device that emits blue (B) light, and thus the phosphor layer 180 performs the rote of converting the blue (B) light into the color of a sub-pixel. The phosphor layer 180 may also be a red phosphor layer 181 or green phosphor layer 182 constituting individual pixels.

In other words, a red phosphor 181 capable of converting blue light into red (R) light may be deposited on the blue semiconductor light emitting device 150 at a location implementing a red sub-pixel, and a green phosphor 182 capable of converting blue light into green (G) light may be deposited on the blue semiconductor light emitting device 150 at a location implementing a green sub-pixel. Furthermore, the blue semiconductor light emitting device 150 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
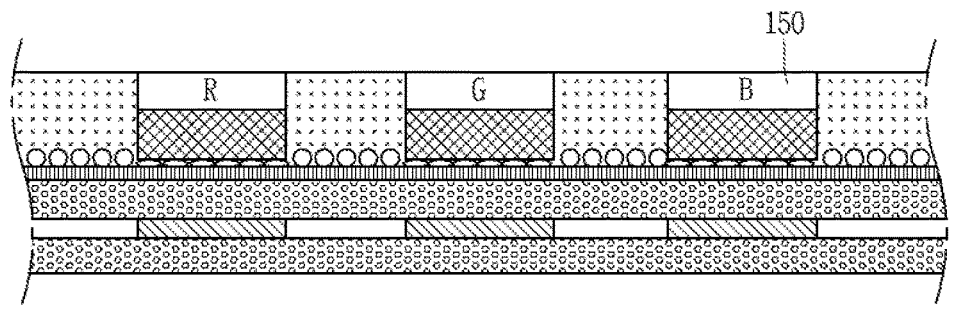
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various light including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
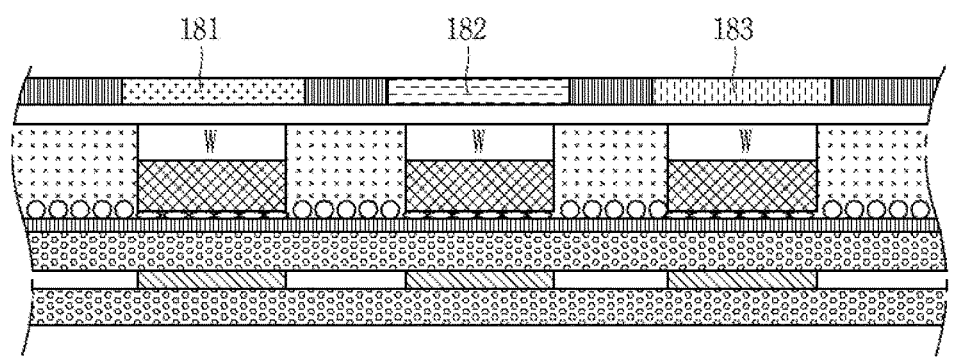

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
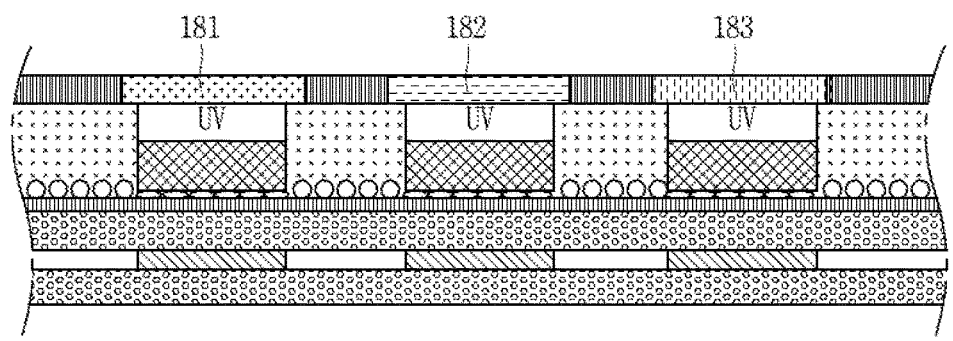

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. The size of the individual semiconductor light emitting device 150 may be less than 80 μm in the length of one side thereof, and formed with a rectangular or square shaped element. For a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, for a rectangular pixel in which one side of a sub-pixel is 600 μm in size, and the remaining one side thereof is 300 μm, a relative distance between the semiconductor light emitting devices becomes sufficiently large. Accordingly, in this instance, it is possible to implement a flexible display device having a HD image quality.

A display device using the foregoing semiconductor light emitting device will be fabricated by a new type of fabrication method. Hereinafter, the fabrication method will be described with reference to FIG. 6. In particular, FIG. 6 includes cross-sectional views illustrating a method of fabricating a display device using a semiconductor light emitting device according to an embodiment of the present disclosure.

Figure 6:
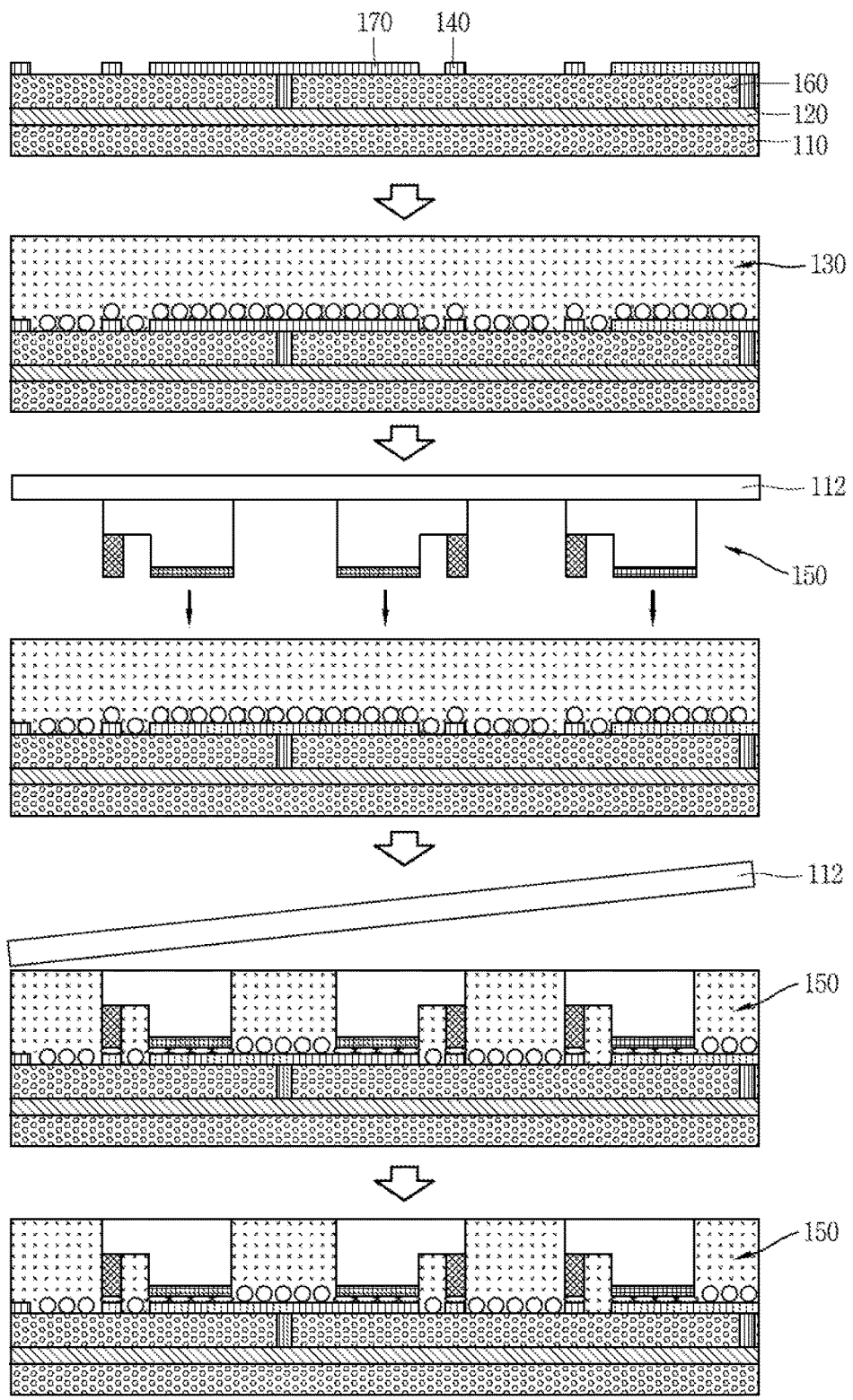
FIG. 6 includes cross-sectional views illustrating a method of fabricating a display device using a semiconductor light emitting device according to an embodiment of the present disclosure.

Referring to FIG. 6, first, the conductive adhesive layer 130 is formed on the insulating layer 160 located with the auxiliary electrode 170 and second electrode 140. In addition, the insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device. As discussed above, the conductive adhesive layer 130 may be an anisotropic conductive film, for example, and thus, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. In this instance, the second substrate 112 as a growth substrate for growing the semiconductor light emitting device 150 may be a sapphire substrate or silicon substrate. Further, the semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. In addition, only a portion between the semiconductor light emitting device 150 and the auxiliary electrode 170 and second electrode 140 have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 can be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

The method may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

In addition, the fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6. Furthermore, according to the following modified example or embodiment, the same or similar reference numerals are designated to the same or similar configurations to the foregoing example, and the description thereof will be substituted by the earlier description.

Figure 7:
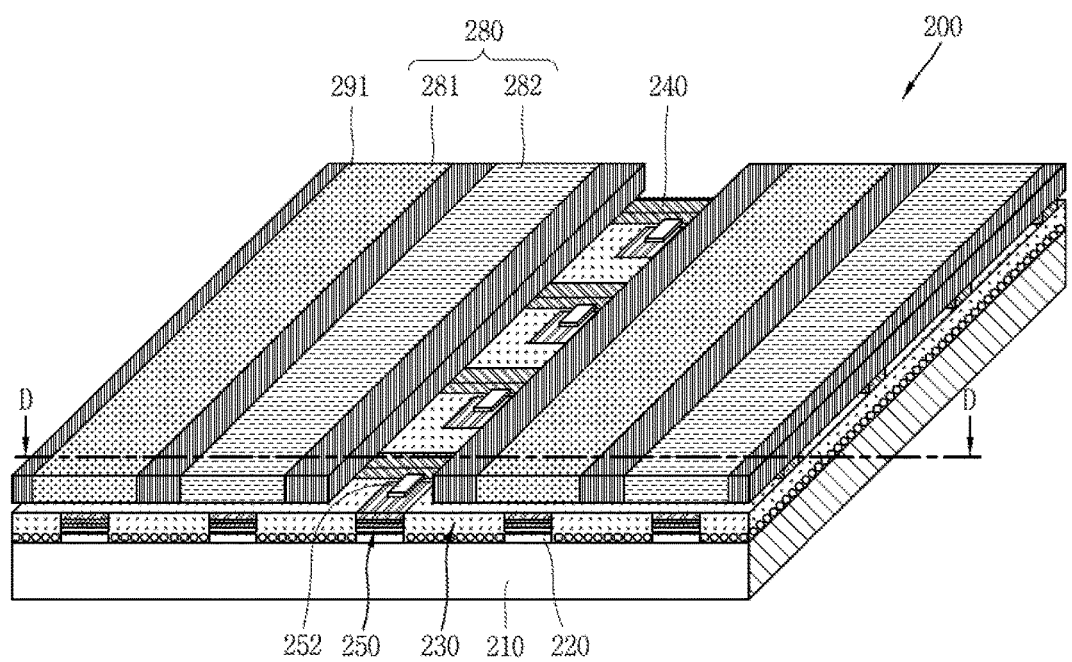
FIG. 7 is a perspective view illustrating a display device using a semiconductor light emitting device according to another embodiment of the present disclosure.
Figure 8:
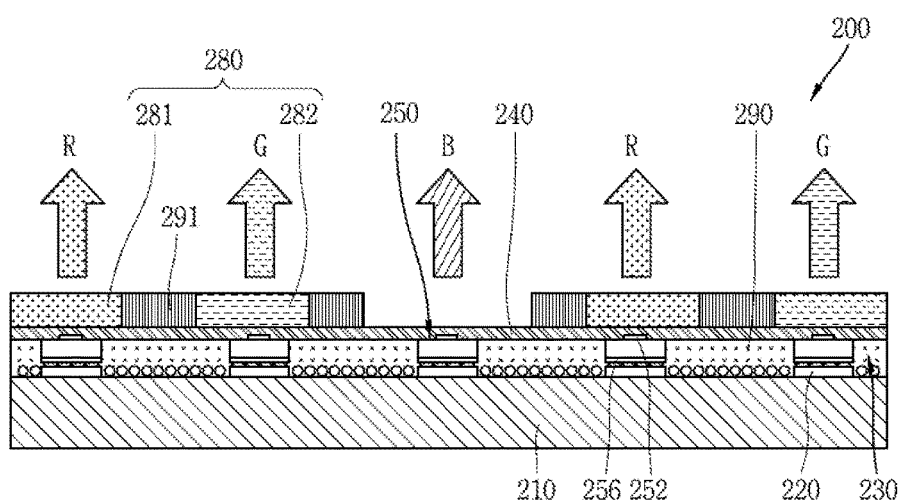
FIG. 8 is a cross-sectional view taken along line D-D in FIG. 7.
Figure 9:
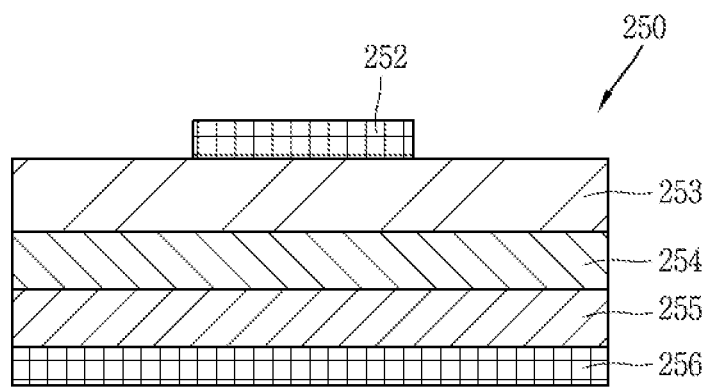
FIG. 9 is a conceptual view illustrating a vertical type semiconductor light emitting device in FIG. 8.

FIG. 7 is a perspective view illustrating a display device 200 using a semiconductor light emitting device according to another embodiment of the present disclosure, FIG. 8 is a cross-sectional view taken along line D-D in FIG. 7, and FIG. 9 is a conceptual view illustrating a vertical type semiconductor light emitting device in FIG. 8.

As shown, the display device 200 can use a passive matrix (PM) type of vertical semiconductor light emitting device. The display device 200 may include a substrate 210, a first electrode 220, a conductive adhesive layer 230, a second electrode 240 and a plurality of semiconductor light emitting devices 250. Further, the substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. In addition, the first electrode 220 may perform the role of a data electrode. The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 being implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 is preferably disposed on the first electrode 220. The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. Further, a plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby advantageously reducing the chip size.

Referring to FIG. 8, a phosphor layer 280 may be formed on one surface of the semiconductor light emitting device 250. For example, the semiconductor light emitting device 250 can be a blue semiconductor light emitting device that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 250 at a location implementing a red sub-pixel, and a green phosphor 282 capable of converting blue light into green (G) light may be deposited on the blue semiconductor light emitting device 250 at a location implementing a green sub-pixel. Furthermore, the blue semiconductor light emitting device 250 may be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied. Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. Further, the second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 can be electrically connected to the n-type electrode of the semiconductor light emitting device 250.

According to FIG. 8, the second electrode 240 can be located on the conductive adhesive layer 230. In addition, a transparent insulating layer containing silicon oxide (SiOx) may be formed on the substrate 210 including the semiconductor light emitting device 250. When the transparent insulating layer is formed and then the second electrode 240 is placed thereon, the second electrode 240 can be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of poor adhesiveness with an n-type semiconductor. Accordingly, the second electrode 240 can be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to FIG. 8, a partition wall 290 may be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 divides individual sub-pixels from one another, and may be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, a black matrix 291 may be disposed between each phosphor layer to enhance contrast. In other words, the black matrix 291 can enhance the contrast of luminance. As described above, the semiconductor light emitting device 250 is located on the conductive adhesive layer 230, thereby constituting individual pixels on the display device. The semiconductor light emitting device 250 also has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

In the display device, semiconductor light emitting devices and a wiring substrate are coupled and electrically-connected to each other by a conductive adhesive layer. In the aforementioned display device, the conductive adhesive layer is configured as an anisotropy conductive film (ACF). However, for the anisotropy conductive film (ACF), when a size of an electrode becomes small, the number of conductive balls per electrode is significantly reduced. Generally, the conductive ball has a size of 3~20 μm. When the display device has a resolution more than 300 ppi (pixel per inch), only several conductive balls are connected to each electrode. Further, when the wiring substrate and the semiconductor light emitting devices are attached to each other, some conductive balls are lost due to the flow of resin. This may cause a lighting yield of an individual semiconductor light emitting device to be lowered. The present invention provides mechanisms capable of obtaining electrical reliability in a conductive adhesive layer, in spite of a display of a fine pitch. Hereinafter, a display device having such mechanisms will be explained in more detail with reference to the attached drawings.

Figure 10A:
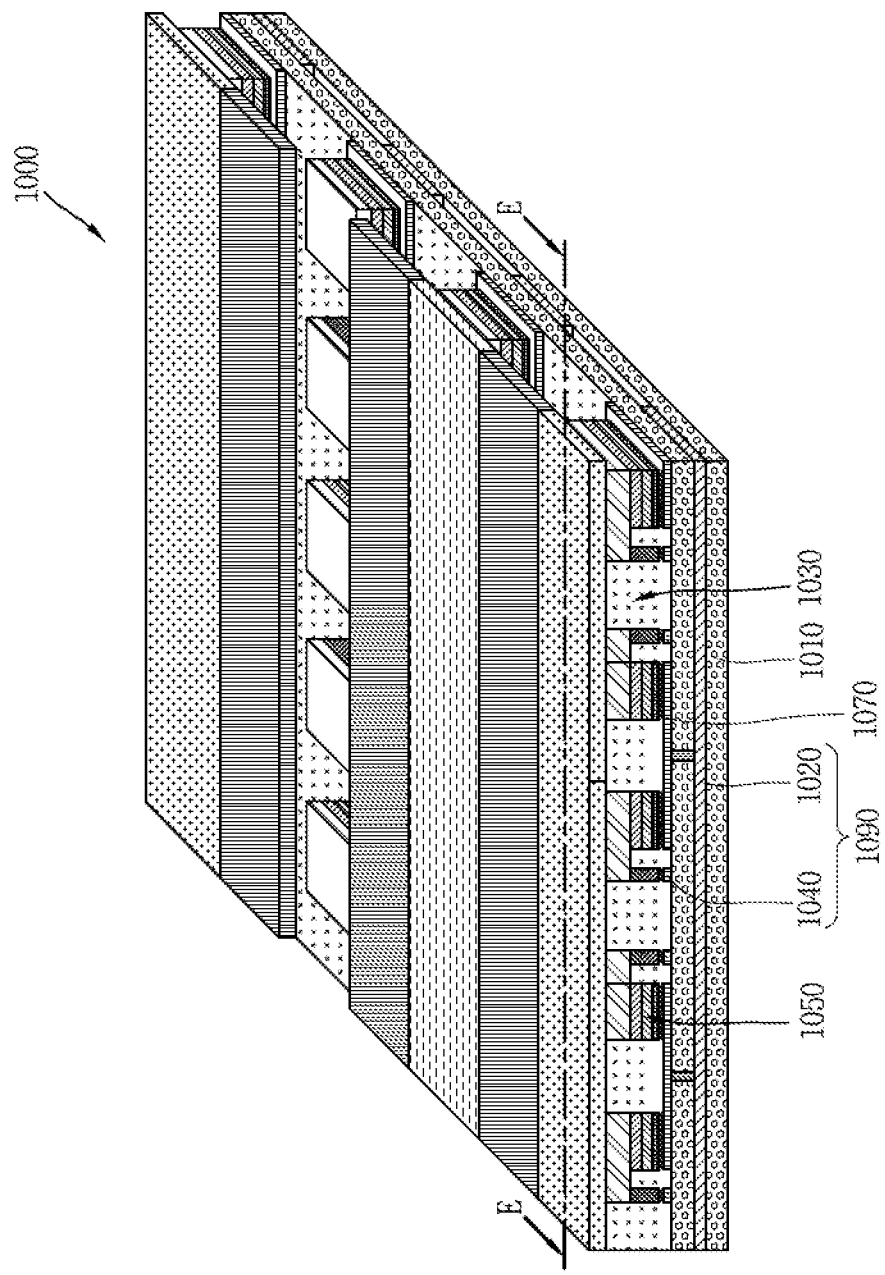
FIG. 10A is a perspective view of a display device according to an embodiment of the present invention.
Figure 10B:
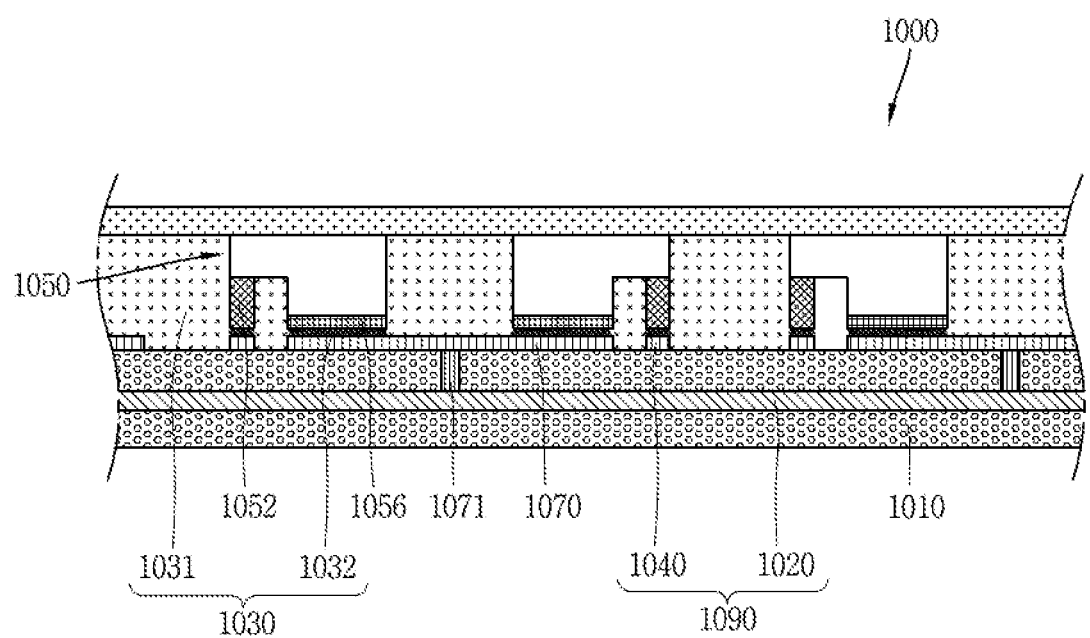
FIG. 10B is a sectional view taken along line 'E-E' in FIG. 10A.
Figure 11A:
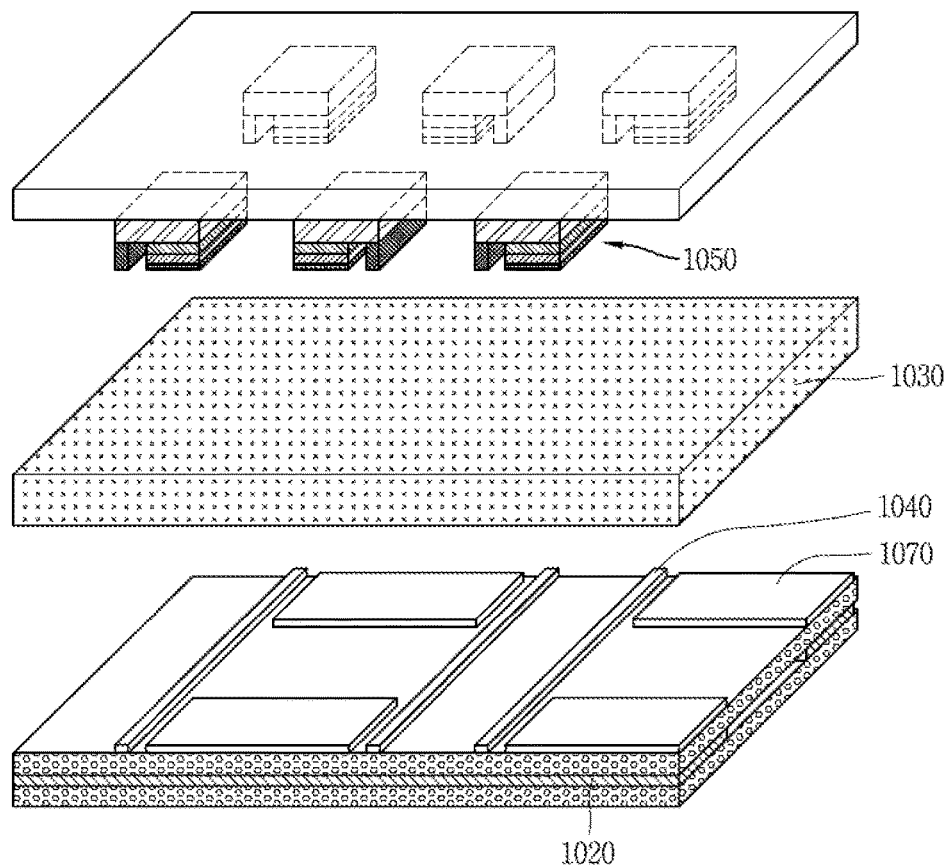
FIG. 11A is a view illustrating attachment processes between a wiring substrate and semiconductor light emitting devices, using a metal-organic conductive film.

In particular, FIG. 10A is a perspective view of a display device according to an embodiment of the present invention, FIG. 10B is a sectional view taken along line 'E-E' in FIG. 10A, FIG. 11A is a view illustrating attachment processes between a wiring substrate and semiconductor light emitting devices, using a metal-organic conductive film, and FIG.

11B is a conceptual view illustrating processes to precipitate a metallic material from a metal-organic conductive film of FIG. 10A.

Referring to FIGS. 10A and 10B, a display device 1000 using a passive matrix (PM) type of semiconductor light emitting device is provided. The following embodiments are also applicable to an active matrix (AM) type of semiconductor light emitting device.

The display device 1000 according to this embodiment includes a substrate (or wiring substrate) 1010, a first electrode 1020, a second electrode 1040, a plurality of semiconductor light emitting devices 1050, and a conductive adhesive layer 1030. The substrate 1010 may be a flexible substrate. For instance, the substrate 1010 may include glass or polyimide (PI) for implementation of a display device. Alternatively, as the substrate 1010, any material having an insulating property and flexibility, e.g., PEN (Polyethylene Naphthalate), PET (Polyethylene Terephthalate), etc. may be used. The substrate 1010 may also be formed of a transparent material, or an opaque material.

Further, a wiring electrode may serve as the substrate 1010. Thus, the first electrode 1020 and the second electrode 1040 may be a wiring electrode 1090 positioned on the substrate 1010. As shown, an auxiliary electrode 1070 may be positioned on the wiring substrate 1010. In this instance, the auxiliary electrode 1070, an electrode for electrically-connecting the first electrode 1020 to the semiconductor light emitting device 1050, is disposed in correspondence to the first electrode 1020. For instance, the auxiliary electrode 1070 is configured in the form of a dot, and may be electrically-connected to the first electrode 1020 by an electrode hole 1071 provided at the wiring substrate 1010. The electrode hole 1071 may be formed as a conductive material is filled in a via hole. Thus, the auxiliary electrode 1070 may be included in the wiring electrode 1090.

Referring to the drawings, the conductive adhesive layer 1030 is formed on one surface of the wiring substrate 1010. The conductive adhesive layer 1030 may be a layer having an adhesive property and conductivity, and be configured to mechanically and electrically connect the wiring electrode of the wiring substrate 1010 with the plurality of semiconductor light emitting devices 1050. Further, the plurality of semiconductor light emitting devices 1050 may be configured as light emitting diodes (LED)s for forming individual pixels.

As aforementioned with reference to FIGS. 2 to 3B, the conductive adhesive layer 1030 may be configured as a layer which allows electrical connection in a Z-direction, a thickness direction, but which has an electric insulating property in a horizontal X-Y direction. Thus, the conductive adhesive layer 1030 may be referred to as a Z-axis conductive layer. As shown in FIG. 10B, the conductive adhesive layer 1030 includes a body 1031 and a metallic aggregation part 1032. The body 1031 includes resin having an adhesive property, which may be an insulating base member. The resin has ductility, which enables the display device to have a flexible function.

Further, the resin may include an opaque resin for blocking light between the semiconductor light emitting devices 1050. That is, the resin serves as a barrier for blocking light between the semiconductor light emitting devices 1050. For instance, the opaque resin may include a black or white resin. In addition, the metallic aggregation part 1032 is disposed in the body 1031, and may be formed as metallic atoms precipitated from a metal-organic compound are aggregated with each other. Thus, the conductive adhesive layer 1030 may be a metal-organic conductive film (MOCF).

Such a structure is where metallic molecules positioned at upper and lower wirings are connected to each other. In this instance, the metallic molecules are precipitated as the metal-organic compound is decomposed by using an attachment temperature, optical energy or molecular vibration energy, when the metal-organic compound of a micro-powder type is contained in a thermoplastic or thermo-hardening resin and then is positioned in the middle of a wiring connection structure for attachment.

The metallic atoms of the metallic aggregation part may include at least one metal included in a group consisting of Ag, Cu, Au, Ni, Sn, Pt, Zn, Al, Cr, Pd, Ti, Fe and Pb. More specifically, referring to FIG. 11A, a metal-organic conductive film is positioned between a substrate where semiconductor light emitting devices 1050 have been arrayed and a wiring substrate. Then, the two substrates are attached to each other, so that the semiconductor light emitting devices 150 and the wiring substrate are coupled to each other electrically and mechanically. More specifically, the semiconductor light emitting devices 150 and a body of the wiring substrate are attached to a body of the metal-organic conductive film.

And an n-type conductive electrode 1052 or a p-type conductive electrode 1056 of the semiconductor light emitting device 1050 is electrically-connected to the wiring electrode 1090 of the wiring substrate. That is, the metallic aggregation part is configured to electrically-connect the wiring electrode with the conductive electrode of the plurality of semiconductor light emitting devices.

FIG. 11A also illustrates the semiconductor light emitting device 1050, the conductive adhesive layer 130 and the first electrode 1020, second electrode 1040 and auxiliary electrode 1070 in an exploded view.

In this instance, the body is an adhesive resin including a thermoplastic resin based on an epoxy-based thermo-hardening resin. The adhesive resin may contain a metal-organic compound therein. 20~50 w % of metal-organic compound may be contained, and a thickness of the metal-organic conductive film may be about 10 μm. The attachment process may be performed with three steps according to a temperature.

Firstly, a primary attachment is performed at a range of about 70~140° C. more than a glass transition temperature of an adhesive resin. In this instance, the two substrates are adhered to each other so that an adhesive resin can fill an empty space therebetween as metallic wirings of the two substrates come close to each other. The attachment may be performed at a predetermined temperature within a range of a first-step temperature. However, the attachment may be performed while a temperature is increased to a two-step attachment temperature.

A two-step attachment temperature is a temperature where metallic atoms are precipitated from a metal-organic compound. Ag is precipitated from Ag-acetate at about 200° C. In case of a metal-organic conductive film having Ag-acetate, the two-step attachment temperature may be about 200° C. or more. An adhesive resin should not be completely hardened at the two-step attachment temperature so that precipitated metallic atoms can sufficiently move to be absorbed and aggregated with the wiring electrode and the conductive electrode.

After the metallic atoms are precipitated for a sufficient time at the two-step attachment temperature, the attachment temperature is increased so that a third-step attachment can be performed at a hardening temperature of the adhesive resin. A hardening temperature of the thermo-hardening resin may be more than a metal reduction temperature of a metal-organic compound, and a glass transition temperature of the thermo-hardening resin may be less than the metal reduction temperature of the metal-organic compound.

Figure 11B:
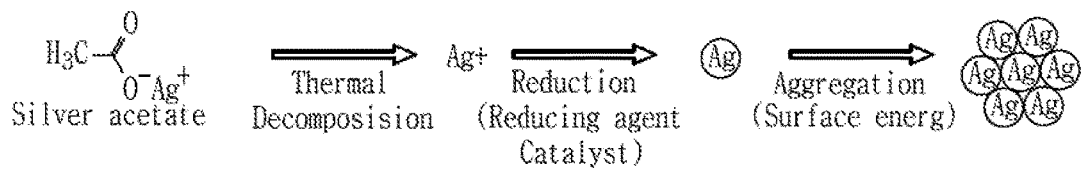
FIG. 11B is a conceptual view illustrating processes to precipitate a metallic material from a metal-organic conductive film of FIG. 10A.

Wiring connection due to precipitation of the metallic atoms from the metal organic compound occurring during the attachment process may be explained as follows (refer to FIG. 11B).

1. As a metal-organic bonding of a metal-organic compound is cut by thermal energy during a connection process, metal positive ions are decomposed.

2. The decomposed metal positive ions are reduced to metallic atoms through a reduction reaction.

3. The reduced metallic atoms are aggregated so as to lower surface energy (Driving Force: Surface Energy)

4. The metallic atoms are attached to a surface of a metallic electrode while being aggregated (Driving Force: Wetting Energy)

Through such processes, a selective metal wetting is performed. That is, an aggregated metal is wet only to an electrode formed of a metallic material, whereas the aggregated metal is scarcely wet to a gap between electrodes having no metallic components. With such a configuration, the semiconductor light emitting devices and the wiring substrate can be stably electrically-connected to each other in a physical-chemical manner, and an insulating property of the substrate can be obtained.

In an embodiment of the present invention, an energy source required during an attachment process may be used as energy required to reduce metallic atoms in a metal-organic compound. However, the present invention is not limited to this. When a metal-organic bonding is decomposed, the body may include not only thermal energy, but also a reducing agent or an additive for accelerating coupling of a metal reduced from the metal-organic compound. For instance, the additive may be provided with oleylamine, and the reducing agent may be provided with phenylhydrazine. In order to accelerate a metal reduction, an electric field may be formed at the wiring electrode by using negative charges, such that electrons required to perform the metal reduction in the metal-organic compound can be supplied.

As another example, an attachment process for hardening an adhesive resin of a metal-organic conductive film by light energy using a photopolymer resin may be applied. The resin may include at least one of a thermoplastic resin and a thermo-hardening resin, as well as a photopolymer resin. Further, a glass transition temperature of the photopolymer resin may be less than a metal reduction temperature of a metal-organic compound. The photopolymer resin may have a characteristic not to be completely hardened at a metal reduction temperature of a metal-organic compound. For instance, the photopolymer resin may be hardened by 80% or less.

During the attachment process, attachment energy may be supplied by providing molecular vibration energy of ultrasonic waves or radio waves. Despite the aforementioned advantage, the metal-organic conductive film may have a limited precipitation amount of metallic atoms. Further, a rough surface of a metallic wiring may not be filled by precipitated metallic atoms. In order to solve such problems, embodiments for implementing electrical connection with higher reliability are described below.

Figure 12:
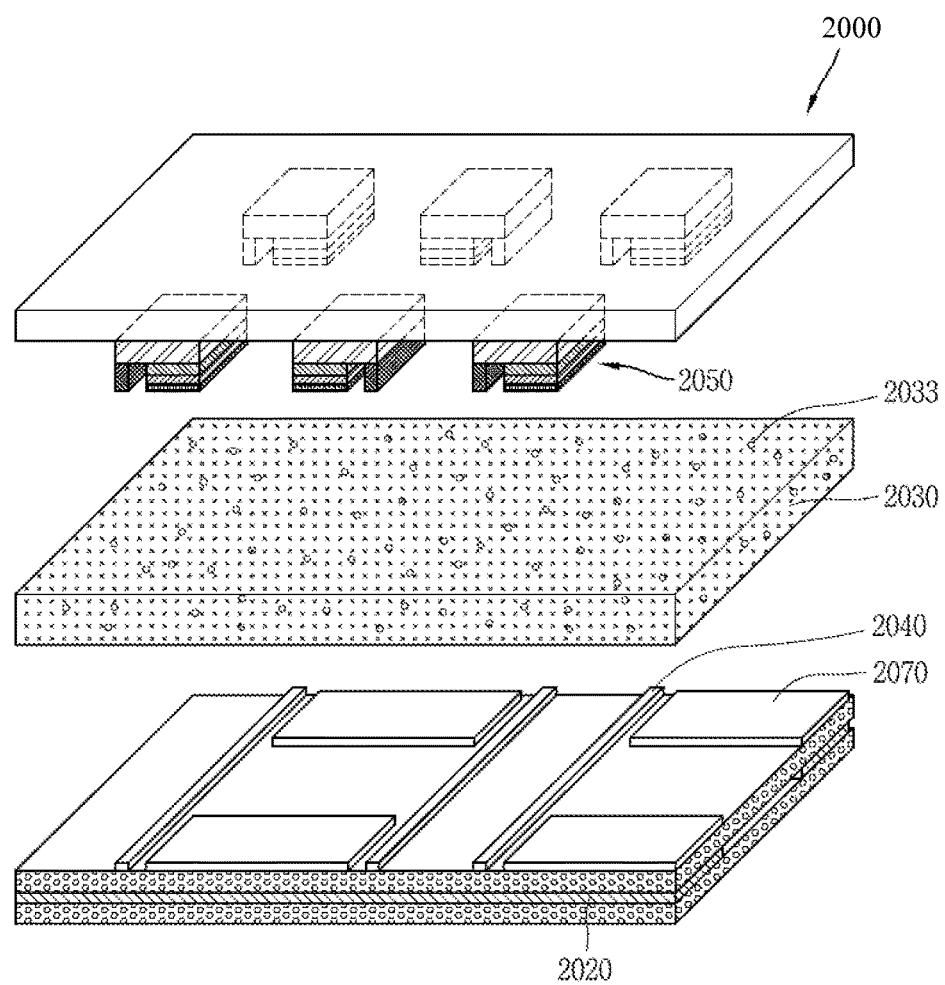
FIG. 12 is a view illustrating attachment processes between a wiring substrate and semiconductor light emitting devices, using a conductive adhesive layer according to another embodiment of the present invention.
Figure 13:
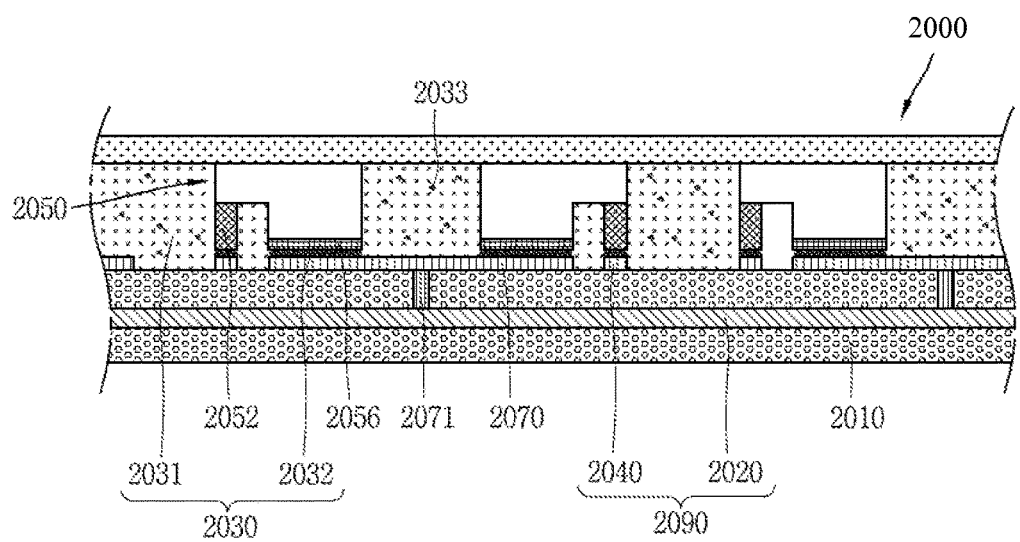
FIG. 13 is a sectional view of a display device manufactured by the processes of FIG. 12.

In particular, FIG. 12 is a view illustrating attachment processes between a wiring substrate and semiconductor light emitting devices, using a conductive adhesive layer according to another embodiment of the present invention, and FIG. 13 is a sectional view of a display device manufactured by the processes of FIG. 12. As shown, a display device 2000 according to this embodiment includes a substrate (or a wiring substrate) 2010, a wiring electrode 2090 including first and second electrodes 2020 and 2040, a conductive adhesive layer 2030, and a plurality of semiconductor light emitting devices 2050. Also shown are auxiliary electrodes 2070, conductive hole 2071, n-type electrode 2052 and p-type electrode 2056. Explanations about the wiring substrate 2010, the wiring electrode 2090, and the plurality of semiconductor light emitting devices 2050 correspond to the descriptions aforementioned with reference to FIGS. 2 to 4, and FIGS. 10A and 10B.

Referring to FIGS. 12 and 13, the conductive adhesive layer 2030 includes a body 2031 and a metallic aggregation part 2032. The body 2031 includes resin having an adhesive property, which may be an insulating base member. The resin has ductility, which enables the display device to have a flexible function. Further, the metallic aggregation part 2032 is disposed in the body 2031, and may be formed as metallic atoms precipitated from a metal-organic compound are aggregated with each other.

The metallic atoms of the metallic aggregation part 2032 may include at least one metal included in a group consisting of Ag, Cu, Au, Ni, Sn, Pt, Zn, Al, Cr, Pd, Ti, Fe and Pb. That is, the metallic atoms, positive ions of the metal-organic compound may include at least one metal included in a group consisting of Ag, Cu, Au, Ni, Sn, Pt, Zn, Al, Cr, Pd, Ti, Fe and Pb. Explanations about the body 2031 and the metallic aggregation part 2032 will be replaced by the descriptions aforementioned with reference to FIGS. 10A and 10B.

In this embodiment, the conductive adhesive layer 2030 may include metallic particles 2033 introduced into the body 2031 so as to accelerate aggregation of the metallic atoms. In particular, metallic particles 2033 serve as seeds of metallic atoms precipitated from a metal-organic compound, thereby increasing the amount of metallic atoms precipitated. Further, the metallic particles 2033 fill a gap between wirings generated due to a curved surface of the wiring substrate, etc., thereby increasing a coupling force between the wirings.

The metallic particles 2033 may be formed of the same material as the metallic atoms, or may be formed of the same material as the wiring electrode. If the metallic particles 2033 are formed of the same material as the metallic atoms of the metal-organic compound, the metallic particles 2033 serve as seeds for reinforcing a metal aggregation force after being precipitated. Further, if the metallic particles 2033 are formed of the same material as the wiring electrode, the metallic particles 2033 reinforce a coupling force between wirings by being aggregated on the wiring electrode.

For instance, the metallic particles 2033 includes at least one metal included in a group consisting of Ag, Cu, Au, Ni, Sn, Pt, Zn, Al, Cr, Pd, Ti, Fe and Pb, a carbon nano tube, or an alloy of the at least one metal. In this instance, metallic atoms of the metallic aggregation part 2032 may include at least one metal included in a group consisting of Ag, Cu, Au, Ni, Sn, Pt, Zn, Al, Cr, Pd, Ti, Fe and Pb. A size of the metallic particles 2033 may be determined by considering a curved surface of the wiring, a tolerance of the conductive electrode of the semiconductor light emitting device, etc. Preferably, the metallic particles 2033 have a size of about several nanometers~several hundreds of nanometers. For instance, the metallic particles 2033 may have a size of 1~1000 nanometers.

Thus, because of the metallic particles 2033, it is possible to observe an attached state with a microscope, through indentations (pressure marks) on a wiring surface. In case of a metal-organic conductive film formed of only a metal-organic compound, it is difficult to observe precipitated metallic atoms with a microscope, because the metallic atoms have a very small size.

In this embodiment, a metal-organic conductive film containing metallic particles is positioned between a substrate where semiconductor light emitting devices have been arrayed and a wiring substrate. Then, the two substrates are attached to each other, so that the semiconductor light emitting devices and the wiring substrate are coupled to each other electrically and mechanically. Explanations about the attachment processes correspond to the descriptions aforementioned with reference to FIGS. 10A and 10B.

For the attachment processes in this embodiment, the body may include not only thermal energy, but also a reducing agent or an additive for accelerating coupling of a metal reduced from the metal-organic compound. For instance, the additive may be provided with oleylamine, and the reducing agent may be provided with phenylhydrazine. In order to accelerate a metal reduction, an electric field may be formed at the wiring electrode by using negative charges, such that electrons required to perform the metal reduction in the metal-organic compound can be supplied.

As another example, an attachment process for hardening an adhesive resin of a metal-organic conductive film containing metallic particles by light energy using a photopolymer resin may be applied. For the attachment processes, an attachment energy can be supplied by providing molecular vibration energy of ultrasonic waves or radio waves.

In the present invention, as another embodiment to overcome problems of the metal-organic conductive film, a method using a low melting point part is provided. This will be explained in more detail with reference to FIGS. 14 and 15. In particular, FIG. 14 is a view illustrating attachment processes between a wiring substrate and semiconductor light emitting devices, using a conductive adhesive layer according to another embodiment of the present invention, FIG. 15 is a sectional view of a display device manufactured by the processes of FIG. 14, and FIG. 16 is a sectional view illustrating a modification example of the display device of FIG. 14.

A display device 3000 according to this embodiment includes a substrate (or a wiring substrate) 3010, a wiring electrode 3090 including first and second electrodes 3020 and 3040, a conductive adhesive layer 3030, and a plurality of semiconductor light emitting devices 3050. Also shown are auxiliary electrodes 3070, conductive hole 3070, n-type electrode 3052 and p-type electrode 2056. Explanations about the wiring substrate 3010, the wiring electrode 3090, and the plurality of semiconductor light emitting devices 3050 correspond to the descriptions aforementioned with reference to FIGS. 2 to 4, and FIGS. 10A and 10B.

Figure 14:
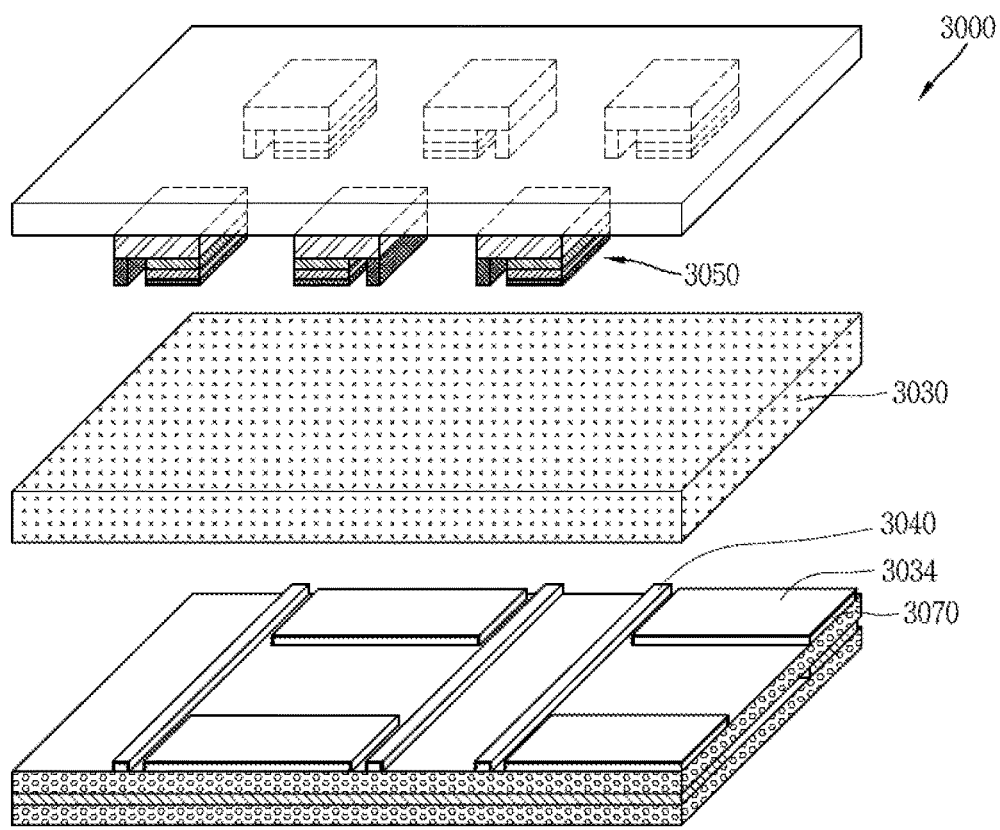
FIG. 14 is a view illustrating attachment processes between a wiring substrate and semiconductor light emitting devices, using a conductive adhesive layer according to another embodiment of the present invention.
Figure 15:
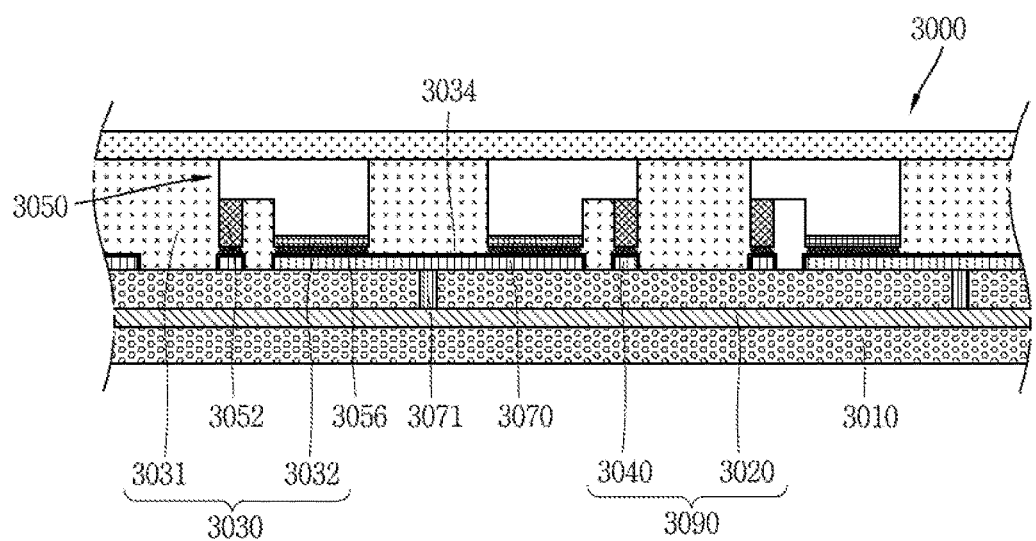
FIG. 15 is a sectional view of a display device manufactured by the processes of FIG. 14.
Figure 16:
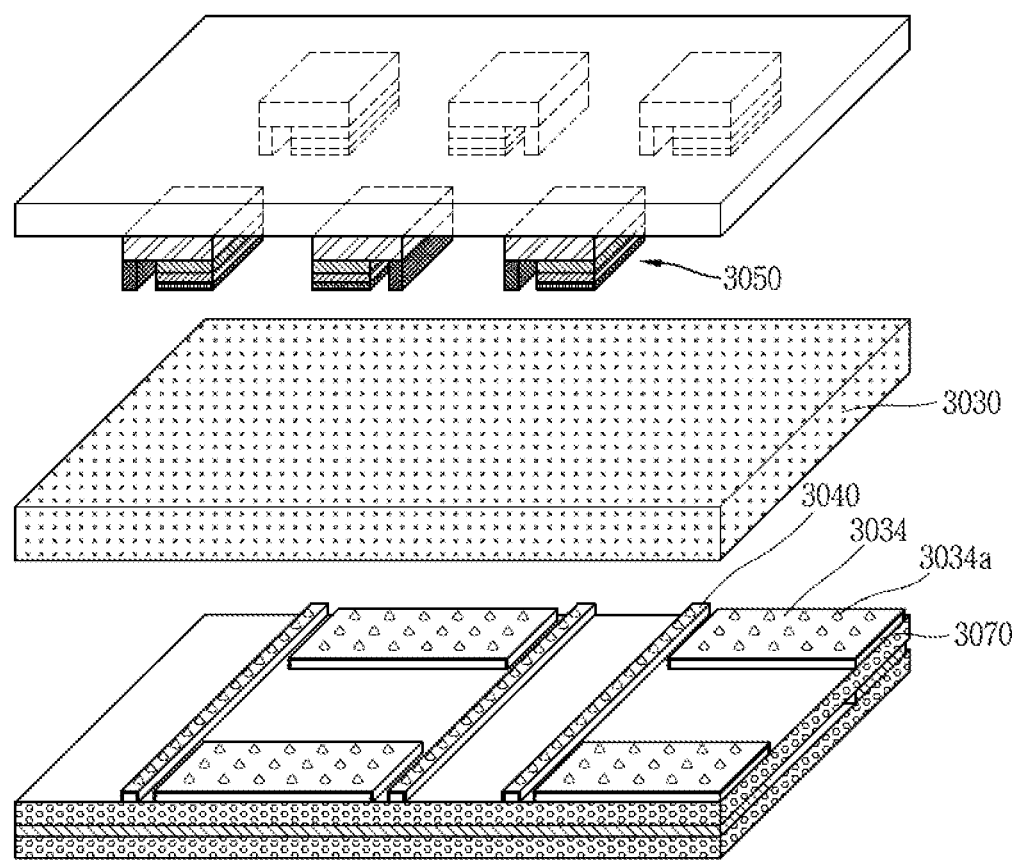
FIG. 16 is a sectional view illustrating a modification example of the display device of FIG. 14.

Referring to FIGS. 14 and 15, the conductive adhesive layer 3030 includes a body 3031 and a metallic aggregation part 3032. The body 3031 includes resin having an adhesive property, which may be an insulating base member. The resin has ductility, which enables the display device to have a flexible function. The metallic aggregation part 3032 is disposed in the body 3031, and may be formed as metallic atoms precipitated from a metal-organic compound are aggregated with each other. The metallic atoms of the metallic aggregation part 3032 may include at least one metal included in a group consisting of Ag, Cu, Au, Ni, Sn, Pt, Zn, Al, Cr, Pd, Ti, Fe and Pb.

Explanations about the body 3031 and the metallic aggregation part 3032 correspond to the descriptions aforementioned with reference to FIGS. 10A and 10B. In this embodiment, the conductive adhesive layer 3030 is formed to enclose a surface of the wiring electrode 3090, and may include a low melting point part 3034 formed of a material having a lower melting point than the wiring electrode 3090. However, the present invention is not limited to this. The low melting point part 3034 may be formed to enclose the wiring electrode and the conductive electrode of the plurality of semiconductor light emitting devices, respectively.

For instance, the low melting point part 3034 may be plated on the wiring electrode 3090 by using a soldering material. The soldering material may be at least one of Sb, Pd, Ag, Au and Bi. In this instance, the soldering material is deposited on the wiring electrode 3090 of the wiring substrate, and a soldering process is performed by using thermal energy applied during an attachment process of a metal-organic conductive film. With such a configuration, a curved surface of a wiring can be filled, and a physical-chemical bonding area between wirings can be increased to enhance a coupling force between the wirings. As aforementioned, the soldering material may be soldered by using the thermal energy, after being deposited on the conductive electrode of the semiconductor light emitting devices.

In this embodiment, attachment processes are performed as follows. A metal-organic conductive film is positioned between a substrate where semiconductor light emitting devices have been arrayed and a wiring substrate having the low melting point part 3034. Then, the two substrates are attached to each other, so that the semiconductor light emitting devices and the wiring substrate are coupled to each other electrically and mechanically. Explanations about the attachment processes may be replaced by the descriptions aforementioned with reference to FIGS. 10A and 10B.

The low melting point part 3034 may be plated with a thickness of 10~2000 nanometers, and a resin of the body 3031 may be a thermo-hardening resin. A melting point of the soldering material may be less than a hardening temperature of the thermo-hardening resin, and may be less than a metal reduction temperature of the metal-organic compound. Alternatively, the melting point of the soldering material may be similar to the metal reduction temperature of the metal-organic compound, i.e., may be within a range of 100~250° C.

For instance, when an attachment temperature is set, a soldering temperature may be less than a hardening temperature of an adhesive resin, and may be less than a reduction temperature of a metal-organic compound. Alternatively, the soldering temperature may be similar to the reduction temperature of the metal-organic compound, i.e., may be within a range of 100~250° C. The soldering material may be plated with a thickness of several nanometers~several hundreds of nanometers. However, in some cases, the soldering material may be plated with a thickness of several micrometers.

For the attachment processes according to this embodiment, the body may include not only thermal energy, but also a reducing agent or an additive for accelerating coupling of a metal reduced from the metal-organic compound. For instance, the additive may be provided with oleylamine, and the reducing agent may be provided with phenylhydrazine. In order to accelerate a metal reduction, an electric field may be formed at the wiring electrode by using negative charges, such that electrons required to perform the metal reduction in the metal-organic compound can be supplied.

As another example, an attachment process for hardening an adhesive resin of a metal-organic conductive film by light energy using a photopolymer resin may be applied. During the attachment processes, an attachment energy can be supplied by providing molecular vibration energy of ultrasonic waves or radio waves.

As another example, as shown in FIG. 16, the low melting point part 3034 includes a plurality of low melting point protrusions 3034a protruded from one surface thereof. The plurality of low melting point protrusions 3034a are sequentially arranged at predetermined intervals therebetween along a line. As a soldering process is performed during the attachment processes under a concaved-convex structure using the protrusions, an electrical connection between the wiring electrode and the semiconductor light emitting devices can be compensated.

Further, the concaved-convex structure may be applied to the present invention according to another embodiment. Hereinafter, a method of using the concaved-convex structure according to another embodiment for overcoming limitations of the metal-organic conductive film will be explained in more detail with reference to FIGS. 17 and 18.

Figure 17:
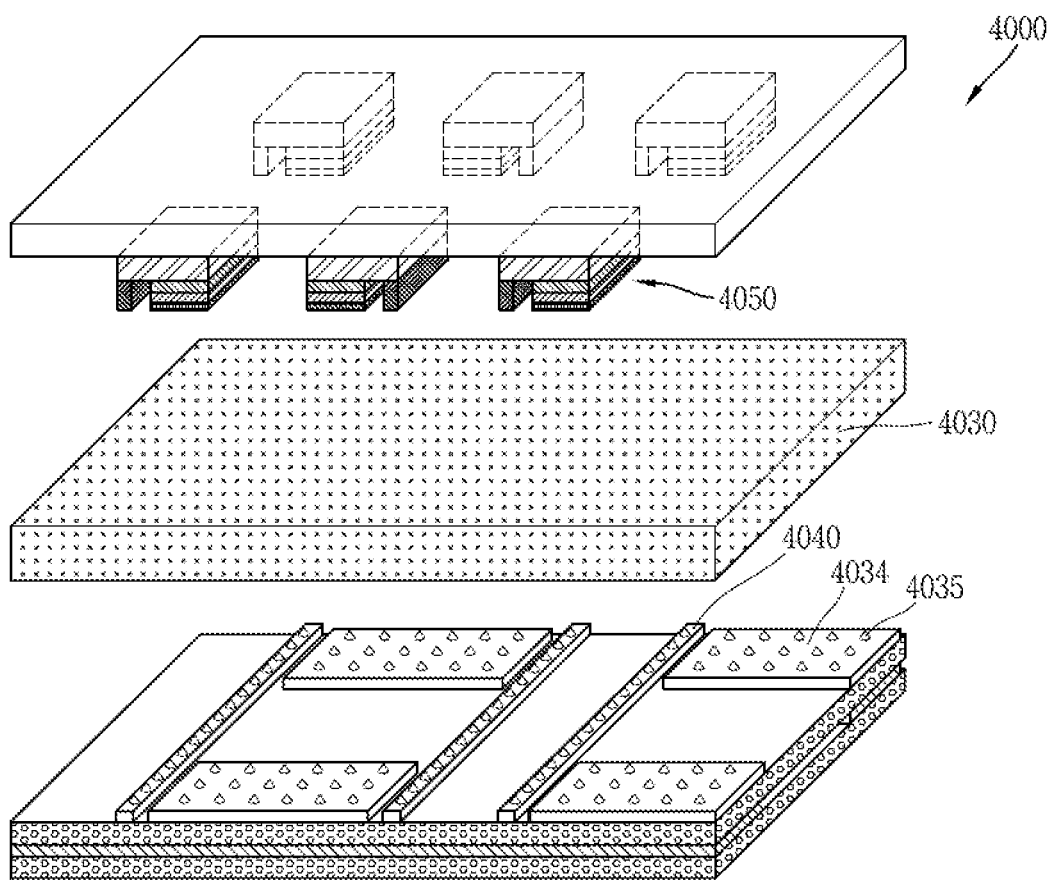
FIGS. 17 and 18 are views illustrating attachment processes between a wiring substrate and semiconductor light emitting devices, using a conductive adhesive layer according to another embodiment of the present invention.
Figure 18:
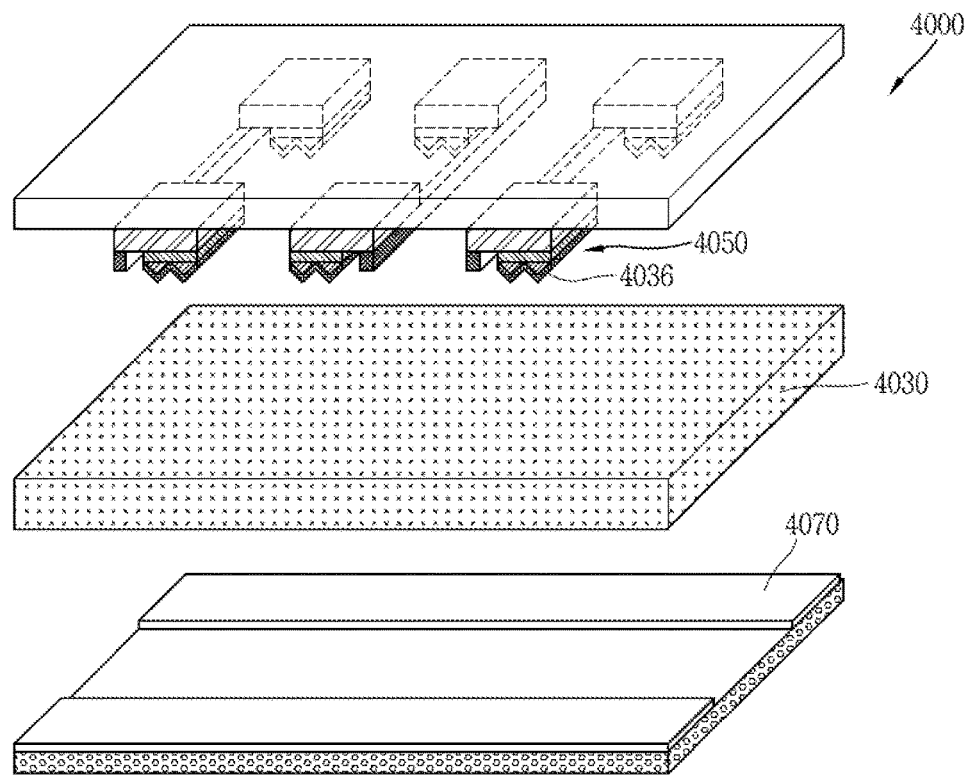
Figure 19:
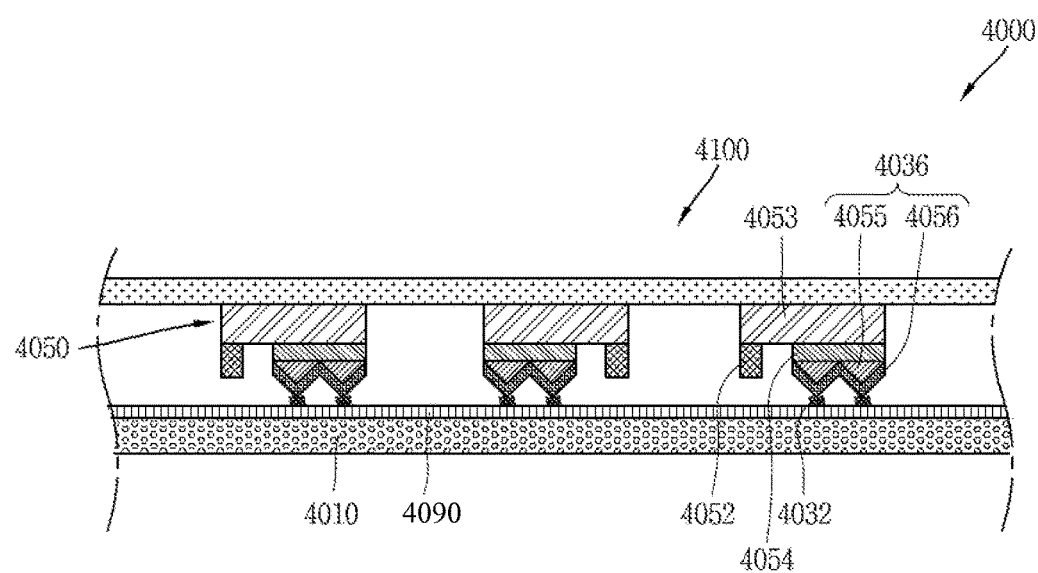
FIG. 19 is a sectional view of a semiconductor light emitting device manufactured by the processes of FIG. 18.

In particular, FIGS. 17 and 18 are views illustrating attachment processes between a wiring substrate and semiconductor light emitting devices, using a conductive adhesive layer according to another embodiment of the present invention. In addition, FIG. 19 is a sectional view of a semiconductor light emitting device manufactured by the processes of FIG. 18. As shown, a display device 4000 according to this embodiment includes a substrate (or a wiring substrate) 4010, a wiring electrode, a conductive adhesive layer 4030, and a plurality of semiconductor light emitting devices 4050 and auxiliary electrodes 4070.

Referring to FIGS. 17 and 18, and similar to FIG. 16, the conductive adhesive layer 4030 includes a body and a metallic aggregation part. The body is provided with resin having an adhesive property, which may be an insulating base member. The resin has ductility, which enables the display device to have a flexible function. The metallic aggregation part is disposed in the body, and may be formed as metallic atoms precipitated from a metal-organic compound are aggregated with each other. The metallic atoms of the metallic aggregation part 4032 may include at least one metal included in a group consisting of Ag, Cu, Au, Ni, Sn, Pt, Zn, Al, Cr, Pd, Ti, Fe and Pb. Explanations about the body and the metallic aggregation part will be replaced by the descriptions aforementioned with reference to FIGS. 10A and 10B.

As shown in FIG. 17, the electrode 4040 and the part 4034 may be provided with a plurality of wiring protrusions 4035 protruded from one surface thereof. In addition, as shown in FIG. 18, a conductive electrode of the plurality of semiconductor light emitting devices 4050 may be provided with a light emitting device protrusion 4036 protruded in one direction. Referring to FIG. 17, the electrode is implemented in the form of a line, and the wiring protrusions 4035 include a plurality of protrusions sequentially disposed at predetermined intervals along the line. The plurality of protrusions may be formed through a plating deposition, after the wiring electrode is etched by a masking process and then is exposed to the outside at positions of the protrusions.

Referring to FIGS. 18 and 19, the light emitting device protrusion 4036 may be protruded from one surface of the conductive electrode toward the wiring electrode. The semiconductor light emitting device 4050 having the light emitting device protrusion 4036 may have a concaved-convex structure. Further, the semiconductor light emitting device 4050 may be a flip chip type light emitting device. For instance, the semiconductor light emitting device 4050 includes a p-type electrode 4056, a p-type semiconductor layer 4055 where the p-type electrode 4056 is formed, an activation layer 4054 formed on the p-type semiconductor layer 4055, an n-type semiconductor layer 4053 formed on the activation layer 4054, and an n-type electrode 4052 spaced from the p-type electrode 4056 in a horizontal direction on the n-type semiconductor layer 4053.

In this instance, the wiring substrate 4010 may have a wiring structure different from that aforementioned with reference to FIGS. 2 to 4. For instance, the n-type electrode 4052 is implemented in the form of a line, and is arranged on a semiconductor light emitting device array. Thus, an additional wiring electrode is not disposed on the wiring substrate 4010, but a connection wiring for connecting the n-type electrode implemented in the form of a line with a driving part may be provided. In this instance, the wiring electrode 4090 on the wiring substrate 4010 may be implemented in the form of a line, and may be electrically-connected to the p-type electrode 4056. The structure of the wiring substrate and the structure of the semiconductor light emitting device may be applied to the embodiments explained with reference to FIGS. 10A to 16.

In this instance, the p-type semiconductor layer 4055 is formed to have a post shape. That is, a conductive semiconductor layer of the plurality of semiconductor light emitting devices 4050 is provided with a concaved-convex part corresponding to the light emitting device protrusion 4036. More specifically, since a conductive semiconductor layer (e.g., p-type semiconductor layer) is formed to have a post shape, a conductive electrode (p-type electrode) formed on one surface of the conductive semiconductor layer has a protruded structure.

This may be formed through a 3D crystalline growth of the semiconductor light emitting device by controlling a growth temperature and a flow amount of a pressure grow gas. Alternatively, a 3D concaved-convex structure may be formed through an etching process after a 2D crystalline growth. In this instance, the concaved-convex structure may have a circular shape, a polygonal dome shape, a conical shape, and a polypyramid shape related to a crystalline structure of a semiconductor light emitting device. If the 3D concaved-convex structure is formed by an etching process, the concaved-convex structure may have a cylindrical shape, a polypyramid shape, and a nano-rod shape.

In the above embodiment, the wiring protrusion 4035 and the light emitting device protrusion 4036 are separately provided. However, both the wiring protrusion 4035 and the light emitting device protrusion 4036 may be provided. In the above embodiments, a method using metallic particles, a method using a low melting point part, and a method using a concaved-convex structure have been disclosed so as to overcome limitations of a metal-organic conductive film. However, the present invention is not limited to this. For instance, in the display device according to an embodiment of the present invention, at least two of the metallic particles, the low melting point part and the concaved-convex structure may be provided.

A structure, capable of overcoming limitations of not only a metal-organic conductive film, but also a conductive adhesive layer having an anisotropy conductive medium such as an anisotropy conductive film, may be implemented by the concaved-convex structure, the low melting point part, etc. Hereinafter, such a mechanism will be explained in more detail with reference to the attached drawings.

Figure 20:
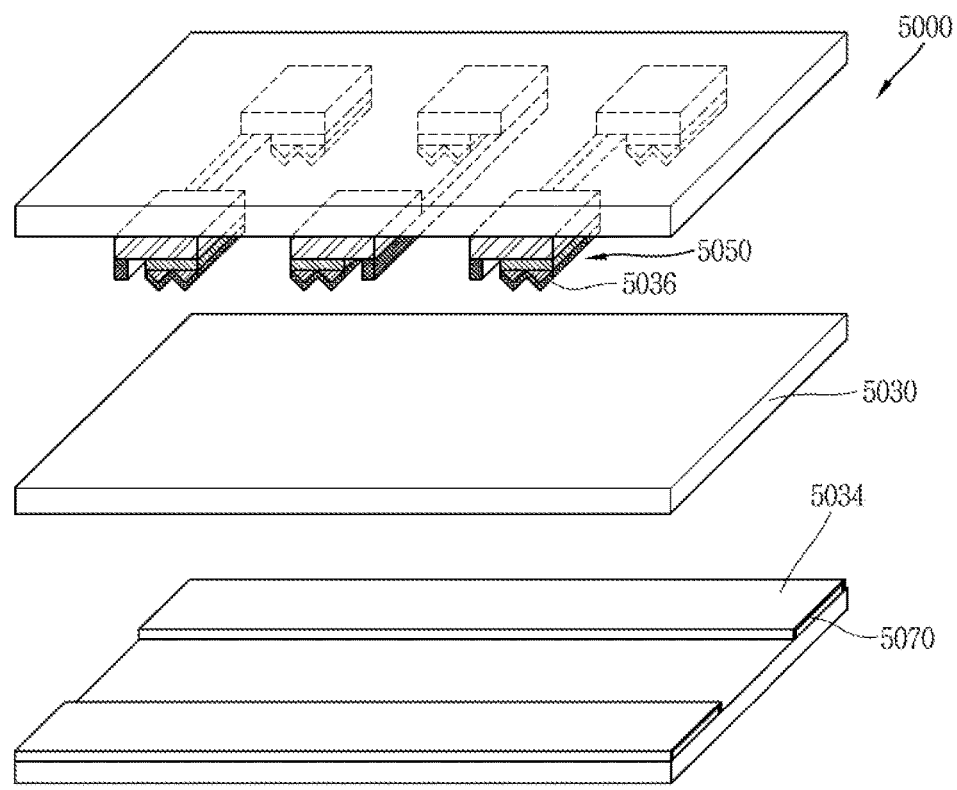
FIG. 20 is a view illustrating attachment processes between a wiring substrate and semiconductor light emitting devices, using an adhesive layer according to another embodiment of the present invention.
Figure 21:
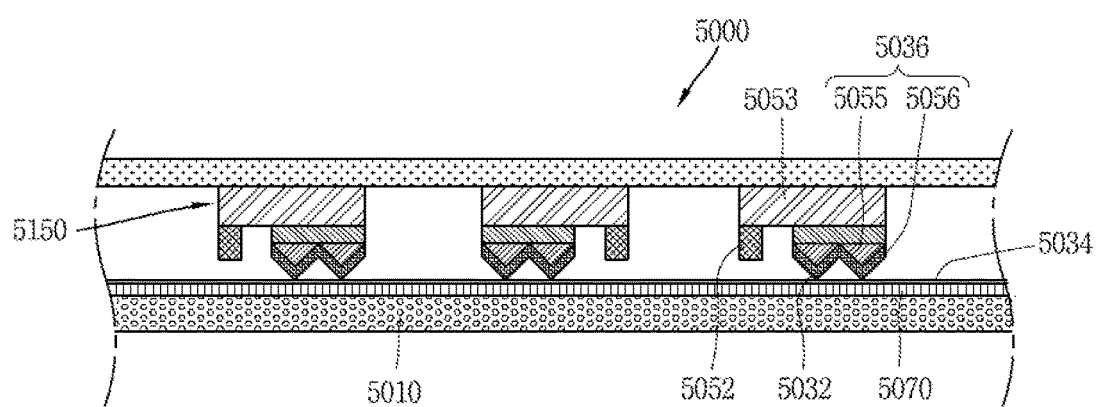
FIG. 21 is a sectional view of a semiconductor light emitting device manufactured by the processes of FIG. 20.

FIG. 20 is a view illustrating attachment processes between a wiring substrate and semiconductor light emitting devices, using an adhesive layer according to another embodiment of the present invention, and FIG. 21 is a sectional view of a semiconductor light emitting device manufactured by the processes of FIG. 20.

A display device 5000 according to this embodiment includes a substrate (or a wiring substrate) 5010, a wiring electrode, an adhesive layer 5030, and a plurality of semiconductor light emitting devices 5050. Explanations about the wiring substrate 5010 and the wiring electrode 5090 will be replaced by the descriptions aforementioned with reference to FIGS. 17 and 18.

Referring to FIGS. 20 and 21, the adhesive layer 5030 is formed of resin having an adhesive property without the aforementioned anisotropy conductive medium (conductive balls or a metallic aggregation part). The resin has ductility, which enables the display device to have a flexible function. The resin may include an opaque resin for block of light between the semiconductor light emitting devices 5050. That is, the resin serves as a barrier for block of light between the semiconductor light emitting devices 5050. For instance, the opaque resin may include a black or white resin.

In this embodiment, a conductive electrode of the plurality of semiconductor light emitting devices 5050 may be provided with a light emitting device protrusion 5036 protruded in one direction. As shown, the light emitting device protrusion 5036 may be protruded from one surface of the conductive electrode toward the wiring electrode. The semiconductor light emitting device 5050 having the light emitting device protrusion 5036 may have a concaved-convex structure.

The semiconductor light emitting device 5050 may be a flip chip type light emitting device. Explanations about a structure of the semiconductor light emitting device 5050 correspond to the descriptions about the semiconductor light emitting device aforementioned with reference to FIGS. 17 and 18.

In this instance, the p-type semiconductor layer 5055 is formed to have a post shape. That is, a conductive semiconductor layer of the plurality of semiconductor light emitting devices 5050 is provided with a concaved-convex part corresponding to the light emitting device protrusion 5036. More specifically, since a conductive semiconductor layer (e.g., p-type semiconductor layer) is formed to have a post shape, a conductive electrode (p-type electrode) formed on one surface of the conductive semiconductor layer has a protruded structure.

This may be formed through a 3D crystalline growth of the semiconductor light emitting device by controlling a growth temperature and a flow amount of a pressure grow gas. Alternatively, a 3D concaved-convex structure may be formed through an etching process after a 2D crystalline growth. In this instance, the concaved-convex structure may have a circular shape, a polygonal dome shape, a conical shape, and a polypyramid shape related to a crystalline structure of a semiconductor light emitting device, if the 3D concaved-convex structure is formed by an etching process, the concaved-convex structure may have a cylindrical shape, a polypyramid shape, and a nano-rod shape.

As shown, the concaved-convex structure of the semiconductor light emitting device may implement physical connection that the conductive electrode penetrates through part of the wiring electrode during attachment processes. With such a configuration, unstable connection due to a 2D planar contact can be solved. In this instance, the wiring electrode may be formed of a softer material than the conductive electrode of the semiconductor light emitting device. An attachment condition may be designed so that the conductive electrode of the concaved-convex structure can penetrate through the wiring electrode by a sufficient attachment pressure.

A low melting point part 5034, formed of a material having a lower melting point than the wiring electrode, may be formed to enclose a surface of the wiring electrode 5090. For instance, the low melting point part 5034 may be plated on the wiring electrode 5090 by using a soldering material. The soldering material may be formed of at least one of Sb, Pd, Ag, Au and Bi. Alternatively, the soldering material may be formed on part of the wiring electrode 5090.

In this instance, a soldering material is deposited on the wiring electrode of the wiring substrate, and a soldering process is performed by using thermal energy applied during an attachment process of the adhesive layer. With such a configuration, a curved surface of a wiring can be filled, and a physical-chemical bonding area between wirings can be increased to enhance a coupling force between the wirings. As aforementioned, the soldering material may be soldered by using the thermal energy in a deposited state on the conductive electrode of the semiconductor light emitting device. For a soldering process, a connected state between two circuits may be enhanced by inducing molecular vibration by adding a frequency during an attachment process. The low melting point part 5034 may be plated with a thickness of 10~2000 nanometers, and a resin of the body may be a thermo-hardening resin. A inciting point of the soldering material may be less than a hardening temperature of the thermo-hardening resin, and may be less than a metal reduction temperature of the metal-organic compound.

For instance, when an attachment temperature is set, a soldering temperature may be less than a hardening temperature of an adhesive resin. The soldering material may be plated with a thickness of several nanometers~several hundreds of nanometers. However, in some cases, the soldering material may be plated with a thickness of several micrometers. The soldering material may be plated on the light emitting device protrusion 5036. In this instance, a soldering process may be performed with higher reliability.

In the aforementioned embodiment, both the light emitting device protrusion 5036 and the low melting point part 5034 are provided. However, only one of the light emitting device protrusion 5036 and the low melting point part 5034 may be provided. That is, only the light emitting device protrusion 5036 may be provided, or only the low melting point part 5034 may be provided.

As another example, metallic particles may be mixed with the adhesive layer. The metallic particles may be the metallic particles aforementioned with reference to FIGS. 12 and 13, which will not be explained. The metallic particles are configured to increase a contact area, as an end part of the concaved-convex structure having a size of several hundreds of nanometers penetrates through the wiring electrode. In this embodiment, conductivity can be obtained by using the concaved-convex structure of the semiconductor light emitting device as a conductive passage, not by using a conductive medium such as conductive balls as a conductive adhesive. Further, a simple structure can be implemented by using an adhesive resin as an adhesive.

The display device according to an embodiment of the present invention includes the following advantages. Firstly, a flexible electrical connection can be implemented with high reliability, because the conductive adhesive layer, formed as metallic atoms precipitated from a metal-organic compound are aggregated with each other, electrically connects the semiconductor light emitting devices with the wiring electrode.

Secondly, lowering of the number of effective conductive balls, due to a size and a density of the conductive balls at a conductive adhesive layer, can be prevented by using a metal-organic compound. Thirdly, since an empty space of the conductive adhesive layer is filled by metallic particles, a connection area can be increased and a contact resistance can be lowered. Fourthly, a soldering process between the semiconductor light emitting devices and the wiring electrode can be performed through the lower melting point part, during an attachment process of the conductive adhesive layer. Fifthly, the semiconductor light emitting devices can implement physical connection to penetrate through part of the wiring electrode during an attachment process, through the protrusion. With such a configuration, unstable connection due to a 2D planar contact can be solved.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device, comprising:
    a wiring substrate having a wiring electrode;
    a plurality of semiconductor light emitting devices which form pixels; and
    a conductive adhesive layer configured to electrically connect the wiring electrode with the plurality of semiconductor light emitting devices,
    wherein the conductive adhesive layer includes:
    a body provided with a resin having an adhesive property;
    a metallic aggregation part disposed in the body, and being aggregated metallic atoms precipitated from a metal-organic compound;
    metallic particles introduced into the body for accelerating the aggregation of the metallic atoms; and
    an additive including oleylamine for accelerating coupling of a metal reduced from the metal-organic compound,
    wherein the metallic aggregation part is configured to electrically connect the wiring electrode with a conductive electrode of the plurality of semiconductor light emitting devices, and
    wherein the metallic aggregation part includes the metal reduced from the metal-organic compound.

2. The display device of claim 1, wherein the metallic particles are formed of the same material as the metallic atoms, or are formed of the same material as the wiring electrode.

3. The display device of claim 2, wherein the metallic particles include at least one metal included in a group consisting of Ag, Cu, Au, Ni, Sn, Pt, Zn, Al, Cr, Pd, Ti, Fe and Pb, a carbon nano tube, or an alloy of the at least one metal.

4. The display device of claim 2, wherein the metallic particles have a size of 1~1000 nanometers.

5. The display device of claim 1, wherein the metallic atoms of the metallic aggregation part include at least one metal included in a group consisting of Ag, Cu, Au, Ni, Sn, Pt, Zn, Al, Cr, Pd, Ti, Fe and Pb.

6. The display device of claim 1, wherein the resin includes a thermo-hardening resin or a photopolymer resin.

7. The display device of claim 1, further comprising:
    a low melting point part formed of a material having a lower melting point than the wiring electrode, and formed to enclose a surface of the wiring electrode.

8. The display device of claim 7, wherein the low melting point part includes a soldering material and is plated on the wiring electrode by using the soldering material.

9. The display device of claim 8, wherein the low melting point part is plated with a thickness of 10~2000 nanometers,
    wherein the resin is a thermo-hardening resin, and
    wherein a melting point of the soldering material is less than a hardening temperature of the thermo-hardening resin.

10. The display device of claim 7, wherein the low melting point part includes a plurality of low melting point protrusions protruded from one surface thereof.

11. The display device of claim 1, wherein the wiring electrode includes a plurality of wiring protrusions protruded from one surface thereof.

12. The display device of claim 1, wherein the conductive electrode of the plurality of semiconductor light emitting devices includes a light emitting device protrusion protruded in one direction.

13. The display device of claim 12, wherein a conductive semiconductor layer of the plurality of semiconductor light emitting devices includes an uneven part corresponding to the light emitting device protrusion.

* * * * *